United States Patent
Chen et al.

(10) Patent No.: US 12,085,848 B2
(45) Date of Patent: Sep. 10, 2024

(54) PHOTOMASK CLEANING TOOL

(71) Applicant: Taiwan Semiconductor Manufacturing Company Limited, Hsinchu (TW)

(72) Inventors: Pin Cheng Chen, Tainan (TW); Chih-Wei Wen, Tainan (TW); Chung-Hung Lin, Tainan (TW); Ting-Hsien Ko, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 187 days.

(21) Appl. No.: 16/947,431

(22) Filed: Jul. 31, 2020

(65) Prior Publication Data
US 2022/0035244 A1 Feb. 3, 2022

(51) Int. Cl.
*G03F 1/82* (2012.01)
*G03F 1/62* (2012.01)

(52) U.S. Cl.
CPC . *G03F 1/82* (2013.01); *G03F 1/62* (2013.01)

(58) Field of Classification Search
CPC .................................. G03F 1/82; G03F 1/62
See application file for complete search history.

(56) References Cited

U.S. PATENT DOCUMENTS

| | | | | |
|---|---|---|---|---|
| 5,927,308 | A * | 7/1999 | Kim | H01L 21/67051 134/144 |
| 6,327,021 | B1 * | 12/2001 | Higashiguchi | G03F 1/82 355/77 |
| 2005/0229946 | A1 * | 10/2005 | Hirae | H01L 21/67051 257/E21.228 |
| 2009/0025761 | A1 * | 1/2009 | Matsumoto | B08B 3/12 134/147 |

(Continued)

FOREIGN PATENT DOCUMENTS

| CN | 107685047 A | 2/2018 | |
|---|---|---|---|
| CN | 110479701 A * | 11/2019 | B08B 13/00 |

(Continued)

OTHER PUBLICATIONS

English machine translation of JP-11143054-A (May 1999) (Year: 1999).*

(Continued)

*Primary Examiner* — Peter L Vajda
*Assistant Examiner* — Jayson D Cosgrove
(74) *Attorney, Agent, or Firm* — Harrity & Harrity, LLP

(57) ABSTRACT

A photomask cleaning tool includes various components to automatically remove a particle from a pellicle, such as a multi-jet nozzle to standardize and control the use of a gas to remove the particle, an ultrasonic probe to loosen the particle from the surface of the pellicle, a plurality of multi-jet nozzles to direct gas toward the particle from different directions, a control system to control the automated blower for various sizes and shapes of photomasks (Continued)

and for optimized particle removal techniques, and/or the like. In this way, the photomask cleaning tool is capable of removing a particle from a pellicle of a photomask in a manner that increases the effectiveness of removing the particle and reduces the likelihood of damage to the pellicle, which would otherwise result in expensive and time-consuming photomask rework.

20 Claims, 10 Drawing Sheets

(56) References Cited

U.S. PATENT DOCUMENTS

| | | |
|---|---|---|
| 2015/0239021 A1 | 8/2015 | Ponomarev |
| 2015/0370160 A1* | 12/2015 | Yamada ............. C03C 23/0075 430/5 |
| 2016/0005591 A1 | 1/2016 | Lu et al. |
| 2016/0074913 A1* | 3/2016 | Hanawa ............. H01L 21/67051 134/1 |
| 2018/0315611 A1* | 11/2018 | Isokawa ............. H01L 21/67219 |
| 2020/0290096 A1* | 9/2020 | Ponomarev ............... B08B 7/04 |

FOREIGN PATENT DOCUMENTS

| | | | |
|---|---|---|---|
| JP | 11143054 A | * 5/1999 | |
| JP | 2006339664 A | * 12/2006 | |
| WO | WO-2020109152 A1 | * 6/2020 | ............... B08B 6/00 |

OTHER PUBLICATIONS

English machine translation of JP-2006339664-A (Dec. 2006) (Year: 2006).*

English machine translation of CN-110479701-A (Nov. 2019) (Year: 2019).*

* cited by examiner

PHOTOMASK CLEANING TOOL

BACKGROUND

A photomask is an apparatus that is used to transfer a pattern (e.g., a die layer pattern, an integrated circuit pattern, and/or the like) to a wafer. A photomask may include a substrate on which the pattern is formed, and a pellicle layer to protect the pattern from damage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
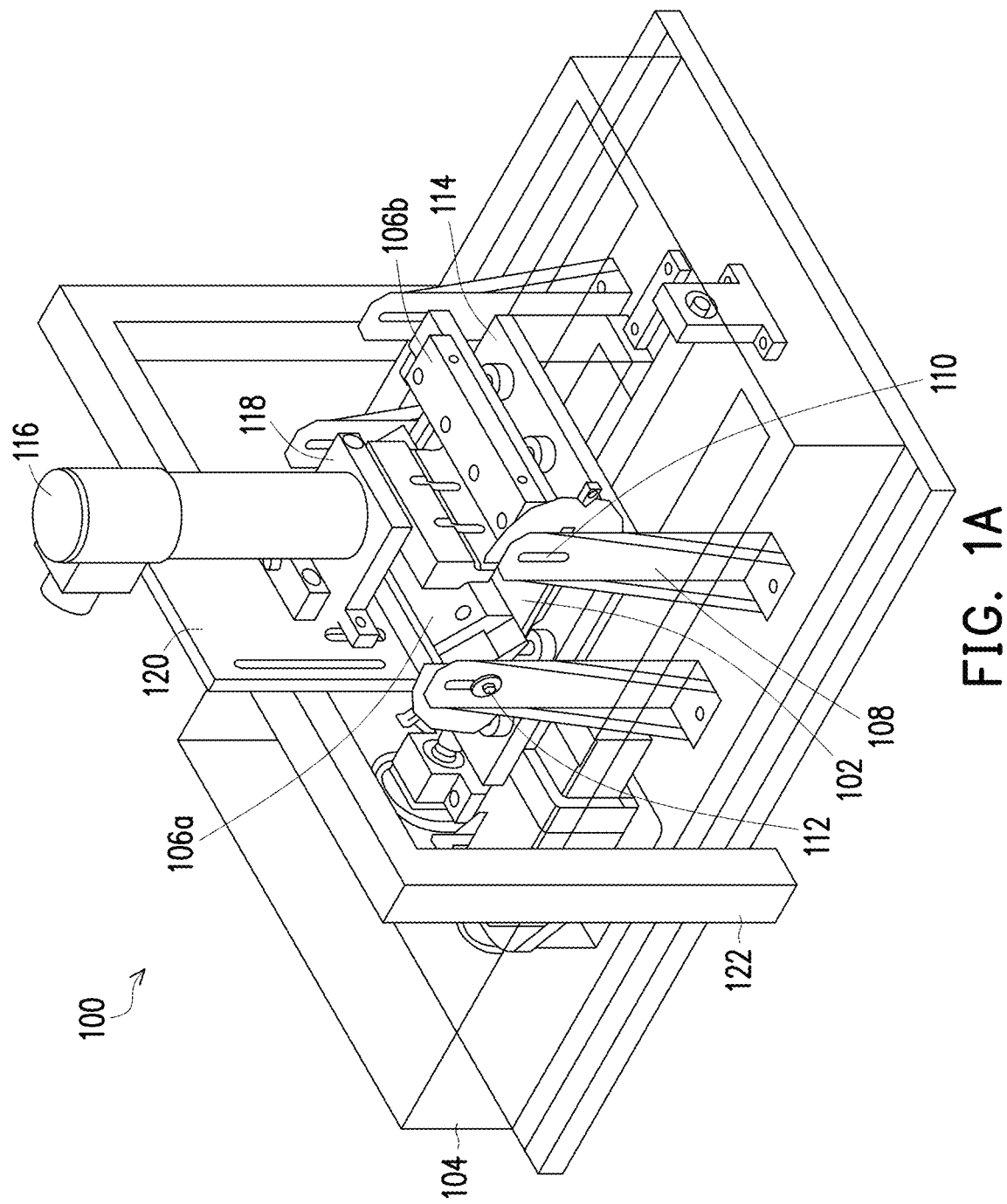
FIGS. 1A-1E are diagrams of an example photomask cleaning tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During the manufacturing process of a photomask, a surface of a pellicle may be inspected for particles (e.g., dust and/or other foreign objects) that may negatively impact the transfer of the pattern from the photomask to a wafer. A particle on the surface of the pellicle may, for example, cause a change in focal point of the photomask, which can cause the pattern that is transferred to the wafer to be distorted. If a particle is identified on the surface of the pellicle, an attempt may be made to remove the particle. If the particle is unable to be removed, the photomask may be transferred to rework, where other more extensive techniques may be used to repair the photomask.

Various techniques may be used to remove a particle from a photomask. For example, a technician may use a compressed gas tool to attempt to blow the particle off the surface of the pellicle with compressed gas. As another example, a technician may use alcohol drops to attempt to loosen and remove the particle from the photomask. These techniques, however, are inconsistent, are prone to human error, may result in tearing and/or damage to the pellicle, may leave behind chemical residue on the surface of the pellicle, and/or the like.

Some implementations described herein provide techniques and apparatuses for removing particles from a photomask pellicle. In some implementations, a photomask cleaning tool, described herein, includes various components to automatically remove a particle from a pellicle, such as a multi-jet nozzle to standardize and control the use of a gas to remove the particle, an ultrasonic probe to loosen the particle from the surface of the pellicle, a plurality of multi-jet nozzles to direct gas toward the particle from different directions, a control system to control the automated blower for various sizes and shapes of photomasks and for optimized particle removal techniques, and/or the like. In this way, the photomask cleaning tool is capable of removing a particle from a pellicle of a photomask in a manner that increases the effectiveness of removing the particle and reduces the likelihood of damage to the pellicle, which would otherwise result in expensive and time-consuming photomask rework.

FIGS. 1A-1E are diagrams of an example photomask cleaning tool 100 described herein. Photomask cleaning tool 100 may be capable of cleaning a pellicle of a photomask 102 by removing particles, debris, and/or other foreign objects from the pellicle. Photomask 102 may include various types of lithography-based photomasks for transferring a device pattern to a wafer or semiconductor device. In some implementations, photomask cleaning tool 100 may be capable of being mounted or positioned on a table or bench (e.g., in a clean room, in a semiconductor fabrication and/or test environment, and/or the like). In some implementations, photomask cleaning tool 100 may be capable of being mounted or positioned in a cabinet or another type of enclosure.

FIG. 1A illustrates a perspective view of photomask cleaning tool 100. As shown in FIG. 1A, photomask cleaning tool 100 may include a housing 104, which is illustrated as transparent for purposes of clarity and visibility of other components and/or devices of photomask cleaning tool 100. Housing 104 may be formed of one or more metals, plastics, and/or other materials such as aluminum, stainless steel, a polycarbonate, and/or the like.

As further shown in FIG. 1A, photomask cleaning tool 100 may include one or more nozzles 106. In some implementations, photomask cleaning tool 100 includes a single nozzle 106. In some implementations, photomask cleaning tool 100 includes a plurality of nozzles 106, such as nozzle 106a and nozzle 106b. Nozzle(s) 106 may be capable of blowing a gas (e.g., air or another type of gas) onto photomask 102 to remove particles from the pellicle of photomask 102. Nozzle(s) 106 may be mounted to and/or supported by support structures 108. Support structures 108 may include brackets, stands, legs, and/or the like. In some implementations, a nozzle 106 may be mounted to and/or supported by a set of support structures 108. In these cases, a nozzle 106 may be mounted to and/or supported by a first support structure 108 at a first end of the nozzle 106, and by a second support structure 108 at a second end of the nozzle 106.

In some implementations, an opening 110 may be formed through a support structure 108, and a fastener 112 may be inserted through opening 110 to secure a nozzle 106 to the support structure 108. In some implementations, the fasteners 112 securing a nozzle 106 to a set of support structures 108 may be loosened such that the height and/or angle of the nozzle 106 (e.g., the height and/or angle relative to photomask 102) may be manually adjusted. In some implementations, the height and/or angle of the nozzle 106 may be automatically adjusted by one or more motors included in photomask cleaning tool 100.

As further shown in FIG. 1A, photomask cleaning tool 100 may include a tray 114. Tray 114 may be configured to hold and/or support photomask 102 before, during, and/or after photomask cleaning tool 100 cleans the pellicle of photomask 102. In some implementations, tray 114 includes a substantially planar structure on which photomask 102 is placed and/or secured. In some implementations, tray 114 includes a fixture to which photomask 102 is mounted. In some implementations, tray 114 is a slidable tray that is capable of moving, translating, and/or sliding in a horizontal (or substantially horizontal) axis. In some implementations, tray 114 may be capable of moving, translating, and/or sliding in a vertical (or substantially vertical) axis. Tray 114 may move along an axis in one or more directions while nozzle(s) 106 blow gas onto the pellicle of photomask 102. In this way, photomask 102 may be moved such that all or particular portions of the pellicle may be blown with gas to remove particles thereon.

As further shown in FIG. 1A, photomask cleaning tool 100 may include an ultrasonic probe 116. Ultrasonic probe 116 may be (or may include) a transmitter device that receives an electrical signal (e.g., an ultrasonic electrical signal) and converts the electrical signal into ultrasonic energy. The ultrasonic energy may travel through the air (or another medium) toward photomask 102 in the form of an ultrasonic wave. The ultrasonic wave may collide with the pellicle, causing a force to be applied to the pellicle. The force causes the pellicle to vibrate, which reduces the surface adhesion force between particle(s) and the surface of the pellicle. This may reduce the magnitude of the removal force needed to remove the particle(s) from the surface of the pellicle.

As further shown in FIG. 1A, ultrasonic probe 116 may be positioned and/or mounted substantially vertical and/or orthogonal to tray 114 and photomask 102 thereon. Ultrasonic probe 116 may be mounted to, held in place by, and/or secured by a mounting plate 118. Mounting plate 118 may include an opening through which ultrasonic probe 116 is inserted. In some implementations, mounting plate 118 is integrated into ultrasonic probe 116. In some implementations, mounting plate 118 and ultrasonic probe 116 are separate components.

Mounting plate 118 may attach to, connect to, and/or mount to another mounting plate 120. In some implementations, mounting plate 118 and mounting plate 120 may be positioned substantially orthogonal. In some implementations, mounting plate 118 is attached to mounting plate 120 through pins, clamps, fasteners, and/or other components. In some implementations, mounting plate 118 is moveable relative to mounting plate 120 such that the height of ultrasound probe 116 may be adjusted.

Mounting plate 120 may attach to, connect to, and/or mount to a support structure 122. Support structure 122 may include rails, brackets, tubes, and/or other types of support structures. In some implementations, mounting plate 120 is attached to support structure 122 through pins, clamps, fasteners, and/or other components. In some implementations, mounting plate 120 is moveable along support structure 122 such that the position of ultrasound probe 116 may be adjusted in a plane that is parallel to tray 114 and photomask 102.

Figure 1B:
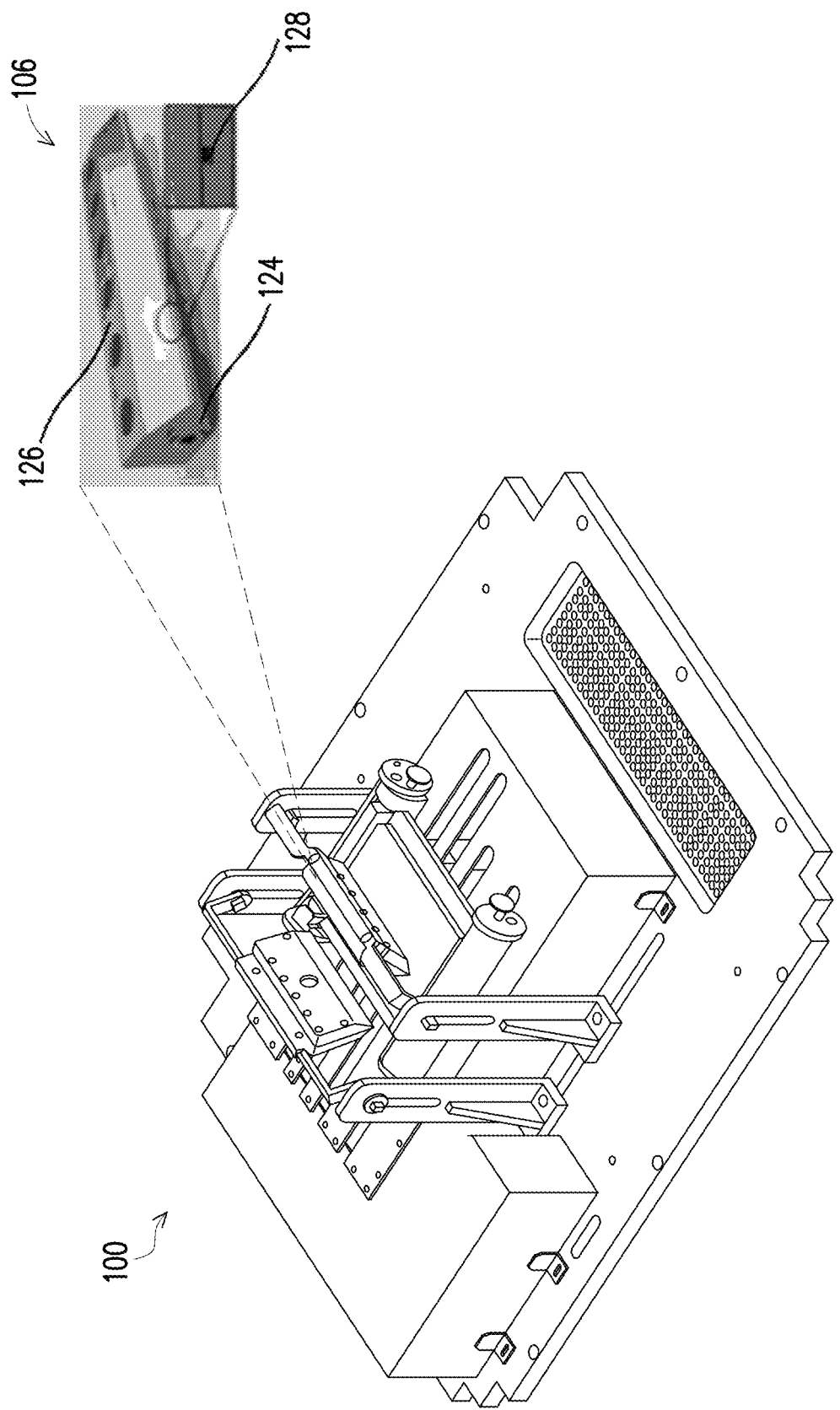
Figure 1C:
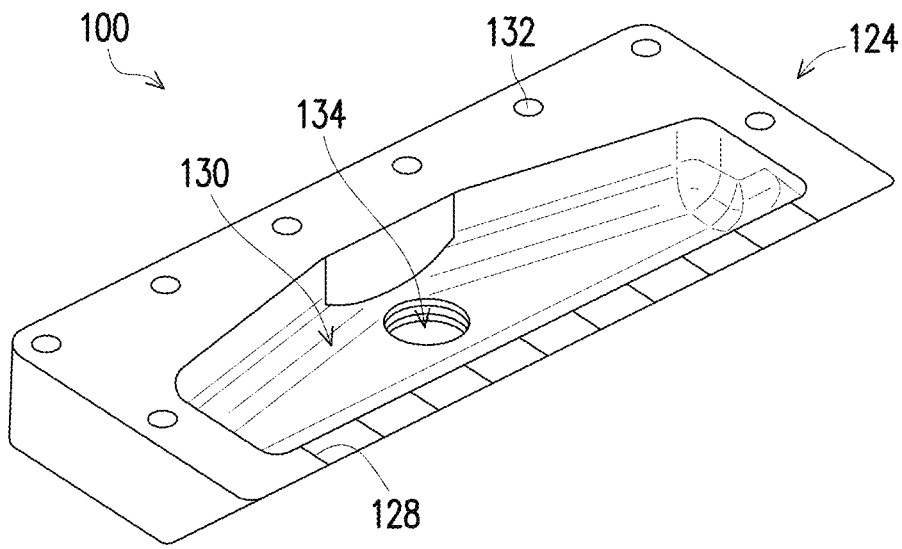
Figure 1D:
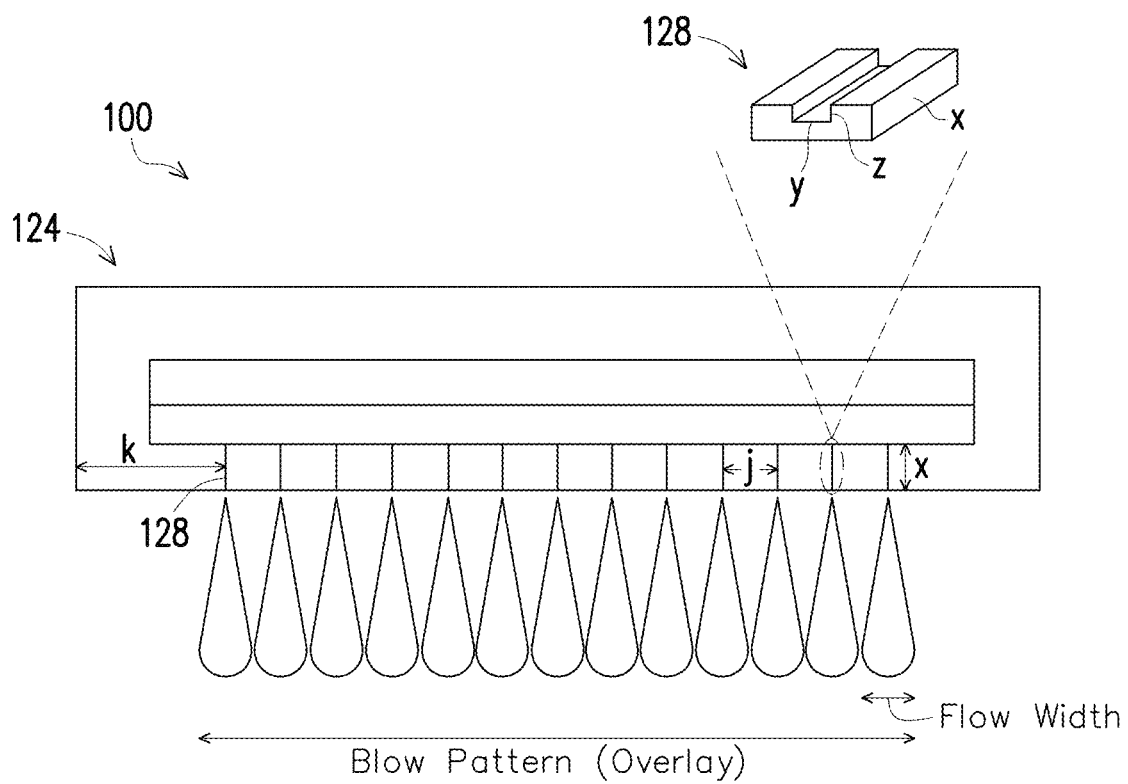

FIGS. 1B-1D illustrate detailed views of a nozzle 106. As shown in FIG. 1B, a nozzle 106 may include a plurality of portions, which may also be referred to as shells, halves, and/or the like. The plurality of portions may include a portion 124 and a portion 126. In some implementations, portion 124 may be an upper shell or an upper half, and portion 126 may be a lower shell or a lower half. In some implementations, portion 124 may be a lower shell or a lower half, and portion 126 may be an upper shell or an upper half. As further shown in FIG. 1B, the nozzle 106 may include a plurality of openings 128, which may also be referred to as gas jets or another type of openings through which the nozzle 106 blows or emits a gas. In some implementations, openings 128 are formed in portion 124. In some implementations, openings 128 are formed in portion 126. In some implementations, openings 128 are formed by the mating or coupling of portion 124 and portion 126. In these cases, one or more sides of openings 128 may be formed in portion 124, one or more sides of opening 128 may be formed in portion 126, and openings 128 may be completed or formed when portion 124 and portion 126 are connected.

As shown in FIG. 1C, openings 128 may be positioned along a front face of portion 124. Moreover, portion 124 may include a cavity 130 through which gas may be distributed along the width of nozzle 106 to evenly (or substantially evenly) supply the gas to openings 128. As further shown in FIG. 1C, portion 124 may include a gas supply port 134, which may be an opening through portion 124 through which gas is supplied to the nozzle 106. In some implementations, gas supply port 134 may be a threaded opening, may be configured for bayonet-style mounting, or may be configured to connect to a gas supply line using another connection technique. In some implementations, gas supply port 134 may be positioned at another location on portion 124, such as a back of portion 124, a side of portion 124, and/or the like.

As further shown in FIG. 1C, portion 124 may further include a plurality of connection points 132 (e.g., screw holes, countersinks, counterbores, and/or the like) by which portion 124 is connected to, attached to, or otherwise coupled with portion 126. In some implementations, portion 126 may also include a cavity through which gas may be distributed along the width of nozzle 106 to evenly (or substantially evenly) supply the gas to openings 128. In some implementations, portion 126 is a flat and/or solid component without a cavity.

As shown in FIG. 1D, an opening 128 may be rectangular shaped. In some implementations, openings 128 may be another shape, such as a square shape, a circular shape, and/or the like. The quantity of openings 128, and/or the dimensions of each opening 128, may be configured to provide a stable and centralized flow (e.g., a flow of gas with relatively low distribution, dispersion, or fanout), and to provide a high-differential gas flow pressure. For example, the length (e.g., x dimension), the width (e.g., y dimension), and the height (e.g., z dimension) may be configured to provide a relatively low flow width and high pressure flow. In some implementations, the length, the width, and/or the height of each opening 128 may be configured to provide a gas flow width roughly equal to the spacing between openings 128 (e.g., j dimension) to minimize the overlap of gas flow paths of adjacent openings 128 (which would result in uneven gas flow pressure in some areas) while providing an overlay blow pattern. An overlay blow pattern may include a blow pattern across the width of the nozzle 106 such that there are no (or minimal) gaps in gas flow paths between adjacent openings 128. Moreover, the openings 128 nearest the sides of portion 124 may be spaced from the sides of portion 124 (e.g., k dimension) based on the expected width or length of the pellicle of photomask 102 to provide blowing coverage substantially across the entire width of the pellicle while reducing or minimizing the blowing of gas onto portions of photomask 102 other than the pellicle. This reduces the likelihood that the gas would cause particles and/or other types of debris to become airborne and land on the pellicle. Examples of the above-described dimensions include a range of 5 millimeters (mm) to 15 mm for the x dimension, 0.1-3 mm for they dimension, 0.1-3 mm for the z dimension, 5-10 mm for the j dimension, and 10-30 mm for the k dimension. An example range for the quantity of openings 128 may include 10-20 openings.

Figure 1E:
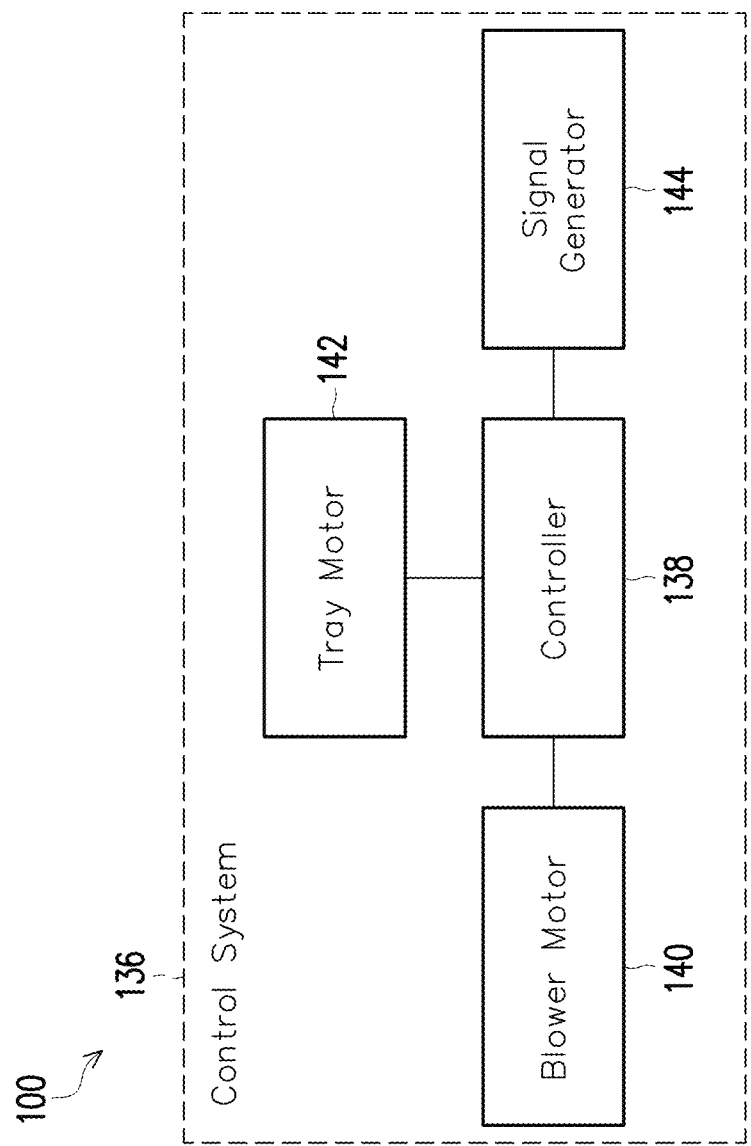

As shown in FIG. 1E, photomask cleaning tool 100 may include a control system 136. Control system 136 may control and/or adjust various parameters and/or components of photomask cleaning tool 100. For example, control system 136 may control and/or adjust various parameters of nozzle(s) 106, tray 114, ultrasonic probe 116, and/or the like. In some implementations, control system 136 may include a controller 138, a blower motor 140, a tray motor 142, a signal generator 144, and/or the like. In some implementations, control system 136 may be a separate device or system from photomask cleaning tool 100. In some implementations, one or more components of control system 136 may be separate from photomask cleaning tool 100, may be included in other device(s), and/or the like.

Controller 138 may receive information (e.g., sensor information) from various components of photomask cleaning tool 100, may determine one or more parameters for the various components of photomask cleaning tool 100, may provide signals and/or instructions to the various components of photomask cleaning tool 100, and/or the like. For example, controller 138 may provide signals and/or instructions to blower motor 140, to tray motor 142, to signal generator 144, and/or to one or more other components.

Blower motor 140 may include various types of motors capable of generating and providing a pressurized flow of gas to nozzle(s) 106. In some implementations, controller 138 may provide signals and/or instructions to blower motor 140 to generate and provide a pressurized flow of gas to nozzle(s) 106 at a particular pressure, at a particular velocity, and/or the like. In some implementations, controller 138 may provide signals and/or instructions to activate blower motor 140 (e.g., to cause blower motor 140 to generate and provide a pressurized flow of gas to nozzle(s) 106) and/or to deactivate blower motor 140. In some implementations, controller 138 may control and/or adjust various parameters of nozzle(s) 106, such as a height of nozzle(s) 106 relative to the surface of the pellicle of photomask 102, an angle of nozzle(s) 106 relative to the surface of the pellicle of photomask 102, and/or the like.

Tray motor 142 may include various types of motors capable of moving, sliding, and/or translating tray 114 along a horizontal axis, along a vertical axis, and/or the like. For example, tray motor 142 may be capable of moving, sliding, and/or translating tray 114 along one or more support rails, support members, support tracks, and/or the like. This permits nozzle(s) 106 to blow gas along the surface of the pellicle of photomask 102 in a scanning pattern (e.g., from one side of the surface of the pellicle of photomask 102 to another side of the surface of the pellicle of photomask 102) while keeping nozzle(s) 106 in a stationary position. In some implementations, tray motor 142 may be capable of moving, sliding, and/or translating tray 114 in a plurality of directions. For example, tray motor 142 may be capable of moving, sliding, and/or translating tray 114 in a first direction such that a first nozzle 106 (e.g., nozzle 106a) blows gas onto the surface of the pellicle of photomask 102 while photomask 102 moves in the first direction, and may be capable of moving, sliding, and/or translating tray 114 in a second (opposing) direction such that a second nozzle 106 (e.g., nozzle 106b) blows gas onto the surface of the pellicle of photomask 102 while photomask 102 moves in the second direction. In some implementations, controller 138 may provide signals and/or instructions to activate tray motor 142, to deactivate tray motor 142, to cause tray motor 142 to move tray 114 in a particular direction, and/or the like.

Signal generator 144 includes various types of electrical signal generators capable of generating and providing an electrical signal to ultrasonic probe 116 at ultrasound frequencies (e.g., 20 kilohertz (kHz) to several gigahertz (GHz)). For example, signal generator 144 includes a frequency generator, a function generator, an ultrasonic signal generator, and/or another type of device capable of generating ultrasonic electrical signal. In some implementations, controller 138 may provide signals and/or instructions to activate signal generator 144, to deactivate signal generator 144, to cause signal generator 144 to generate an ultrasonic electrical signal at a particular frequency, to cause signal generator 144 to generate an ultrasonic electrical signal at a particular power setting (e.g., signal power or amplitude), to cause signal generator 144 to generate an ultrasonic electrical signal of a particular signal construction (e.g., may configure various components of the ultrasonic electrical signal), and/or the like. In some implementations, controller 138 may control and/or adjust various parameters of ultrasonic probe 116, such as a height of ultrasonic probe 116 relative to the surface of the pellicle of photomask 102, a horizontal position of ultrasonic probe 116, and/or the like.

The number and arrangement of components shown in FIGS. 1A-1E are provided as an example. In practice, photomask cleaning tool 100 may include additional components and/or devices, fewer components and/or devices, different components and/or devices, and/or differently arranged components and/or devices than those shown in FIGS. 1A-1E. Additionally, or alternatively, a set of components and/or devices (e.g., one or more components and/or devices) of photomask cleaning tool 100 may perform one or more functions described as being performed by another set of components of photomask cleaning tool 100.

Figure 2:
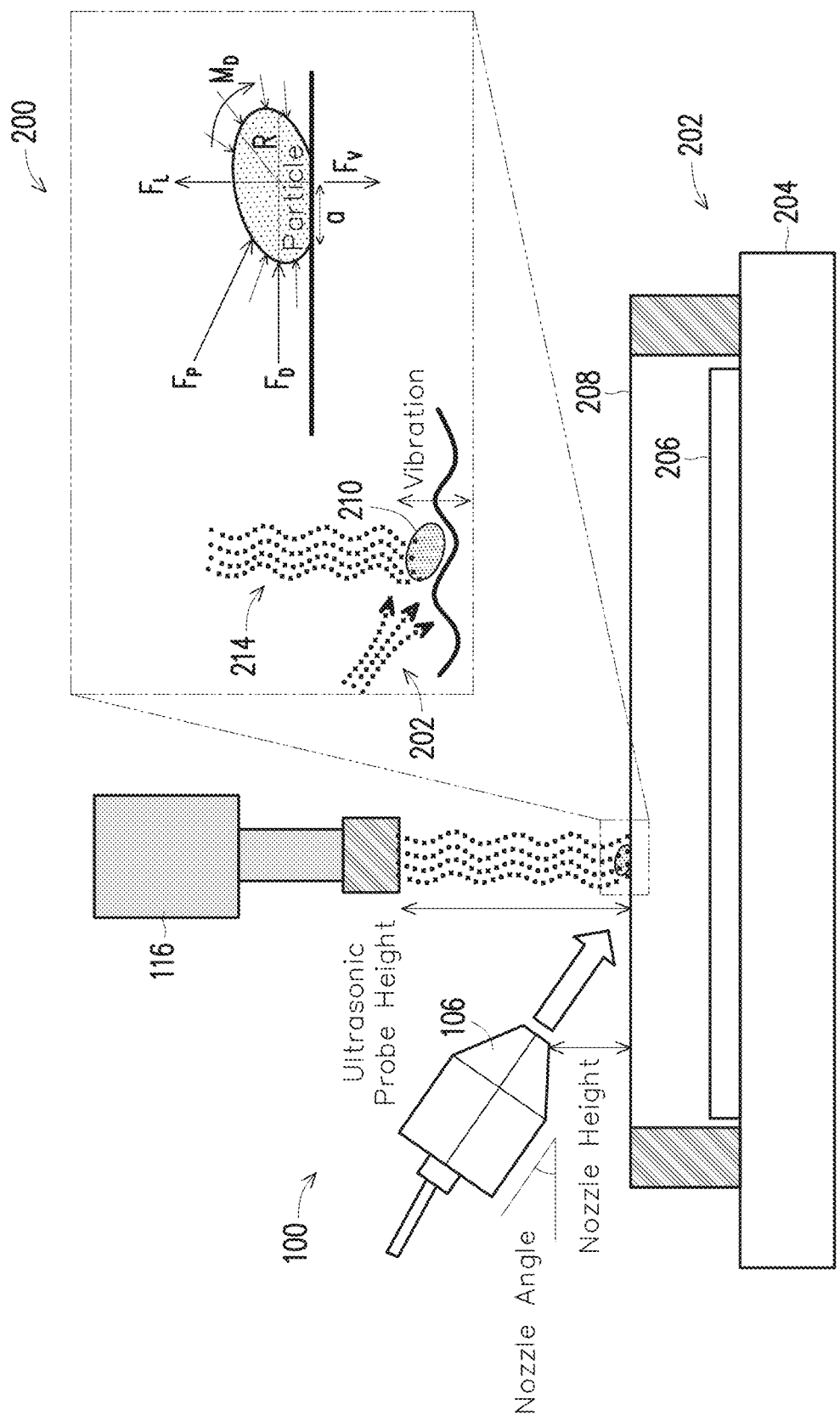
FIGS. 2 and 3A-3C are diagrams of example implementations described herein.

FIG. 2 is a diagram of an example implementation 200 described herein. As shown in FIG. 2, example implementation 200 may include photomask cleaning tool 100 and/or one or more components of photomask cleaning tool 100. Example implementation 200 may be an example implementation of photomask cleaning tool 100 cleaning a photomask 202. As shown in FIG. 2, photomask 202 may include a substrate 204 on which a pattern 206 is formed. Pattern 206 may be protected by a pellicle 208. As further shown in FIG. 2, photomask cleaning tool 100 may clean photomask 202 by removing a particle 210 from a surface of pellicle 208.

To remove the particle from pellicle 208, a nozzle 106 may blow a gas 212 onto the surface of pellicle 208. Gas 212 may apply a force ($F_e$) to particle 210. Controller 138 may determine and configure the force ($F_e$) to be applied to particle 210 by gas 212. In some implementations, controller 138 determines the magnitude of the force ($F_e$) to be applied to particle 210 based on an estimated removal force for removing particle 210 from pellicle 208 and an estimated surface adhesion force between particle 210 and pellicle 208. The estimated removal force may be based on a thickness of pellicle 208, a size of particle 210, a shape of particle 210, an orientation of particle 210, and/or one or more other parameters. In particular, controller 138 may determine the magnitude of the force ($F_e$) to be applied to particle 210 such that the estimated removal force equals or exceeds the estimated surface adhesion force. For example, controller 138 may determine the force ($F_e$) based on:

$$F_D \cdot R + F_L \cdot a + F_P \cdot R + M_D \geq F_V \cdot a$$

where $F_D \cdot R + F_L \cdot a + F_P \cdot R$ $M_D$ represents the estimated removal force and $F_V \cdot a$ represents the estimated surface adhesion force. Moreover, $F_D$ may represent the viscous drag force on particle 210, R may represent the radius of particle 210, $F_L$ may represent the life force of particle 210, a may represent the contact radius of particle 210 (which may be the radius of the surface area of particle 210 in contact with the surface of pellicle 208), $M_D$ may represent the moment of surface stresses for particle 210, and $F_V$ may represent the Van der Waals force on the particle (e.g., the attraction force between the surface of particle 210 and the surface of pellicle 208).

In some implementations, the force ($F_e$) to be applied to particle 210 by gas 212 may be further based on one or more parameters of the nozzle 106 and/or gas 212. In these cases, controller 138 may determine and/or configure the one or more parameters such that gas 212 applies the force ($F_e$) to particle 210. The one or more parameters may include the height of the nozzle 106 relative to the surface of pellicle 208 (e.g., the distance between the surface of pellicle 208 and the nozzle 106), the angle of the nozzle 106 relative to the surface of pellicle 208, a gas pressure of gas 212, a gas velocity of gas 212, and/or the like. In some implementations, controller 138 may determine a particular combination or recipe for the one or more parameters of the nozzle 106 and/or gas 212 for the force ($F_e$) to be applied to particle 210 by gas 212. Example ranges include 20-30° for the angle of the nozzle 106, 8-15 mm for the height of the nozzle 106, and/or 0.5-1 bar for the gas pressure of gas 212.

In some implementations, controller 138 may cause the nozzle 106 to blow gas 212 in a pulsating manner. In these cases, controller 138 may determine and configure the duration and/or frequency of each pulse, such that each pulse of gas 212 provides a high-differential pressure gas flow.

As further shown in FIG. 2, to increase the effectiveness of gas 212 in removing particle 210 from pellicle 208, ultrasonic probe 116 may emit and direct an ultrasonic wave 214 toward pellicle 208. Ultrasonic wave 114 may collide with pellicle 208, causing the surface of pellicle 208 to vibrate. The vibration of the surface of pellicle 208 reduces the surface adhesion force on particle 210, which decreases the force ($F_P$) to be applied to particle 210 by gas 212. The force ($F_P$) to be applied to particle 210 by gas 212 decreases the likelihood that gas 212 will cause damage (e.g., tears, ripples, and/or the like) to pellicle 208. In some implementations, controller 138 may cause ultrasonic probe 116 to emit and direct ultrasonic wave 214 toward pellicle 208 while the nozzle 106 blows gas 212 onto pellicle 208. In some implementations, controller 138 may cause ultrasonic probe 116 and the nozzle 106 to cycle between directing ultrasonic wave 214 toward pellicle 208 and blowing gas 212 onto pellicle 208.

In some implementations, controller 138 may determine and configure one or more parameters of ultrasonic probe 116 and/or ultrasonic wave 214 to reduce the surface adhesion force without causing a level of vibration that might cause damage to pellicle 208. In these cases, controller 138 may determine and configure the height of ultrasonic probe 116 relative to the surface of pellicle 208 (e.g., the distance between ultrasonic probe 116 and the surface of pellicle 208), the construction of ultrasonic wave 214 (e.g., the frequency components of ultrasonic wave 214), the power or amplitude of ultrasonic wave 214, and/or the like. In some implementations, controller 138 may determine and configure one or more parameters of ultrasonic probe 116 and/or ultrasonic wave 214 based on the size of particle 210, the shape of particle 210, the orientation of particle 210, the thickness of pellicle 208, the material used for pellicle 208, and/or the like.

As indicated above, FIG. 2 is provided as an example. Other examples may differ from what is described with regard to FIG. 2.

Figure 3A:
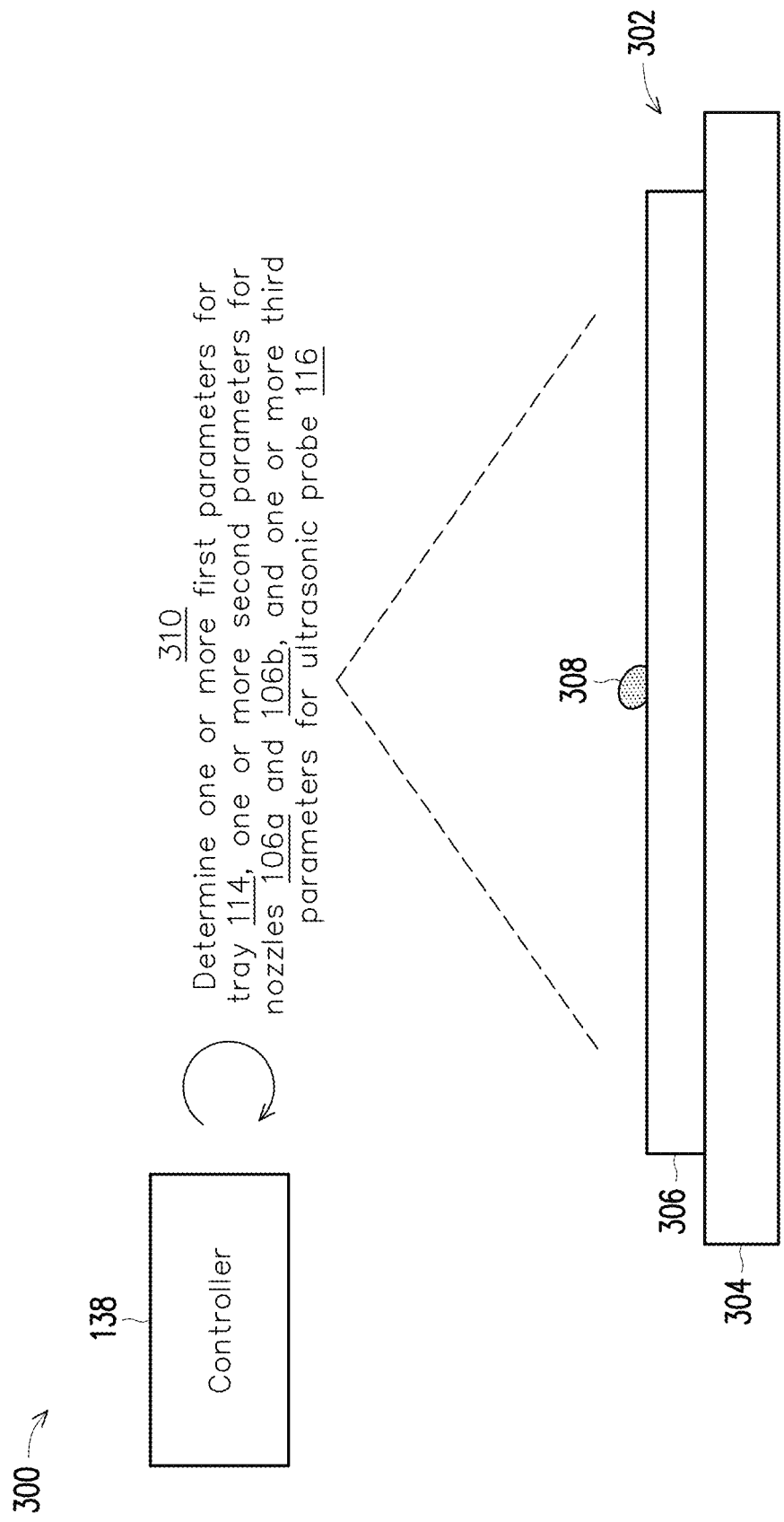
Figure 3B:
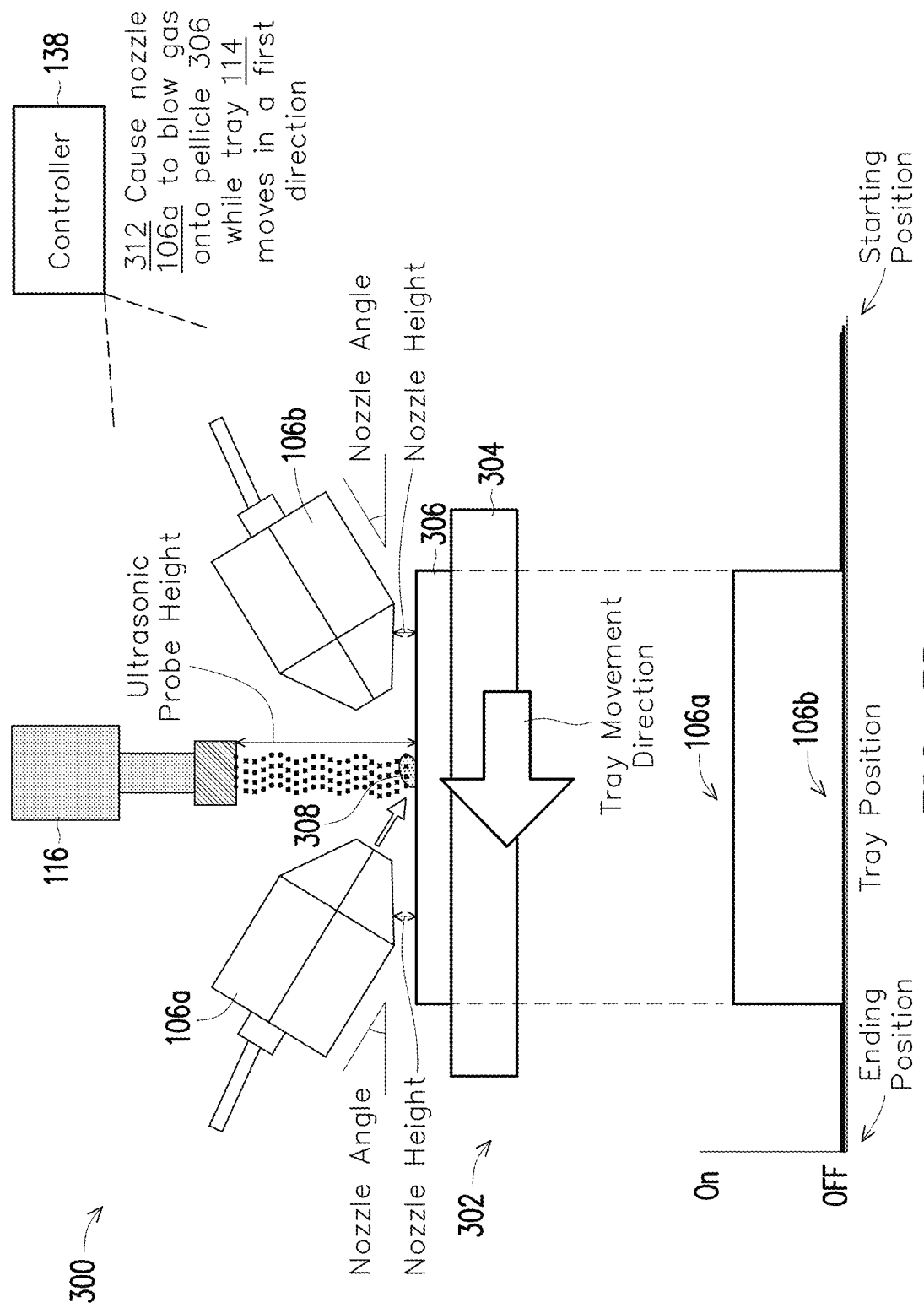
Figure 3C:
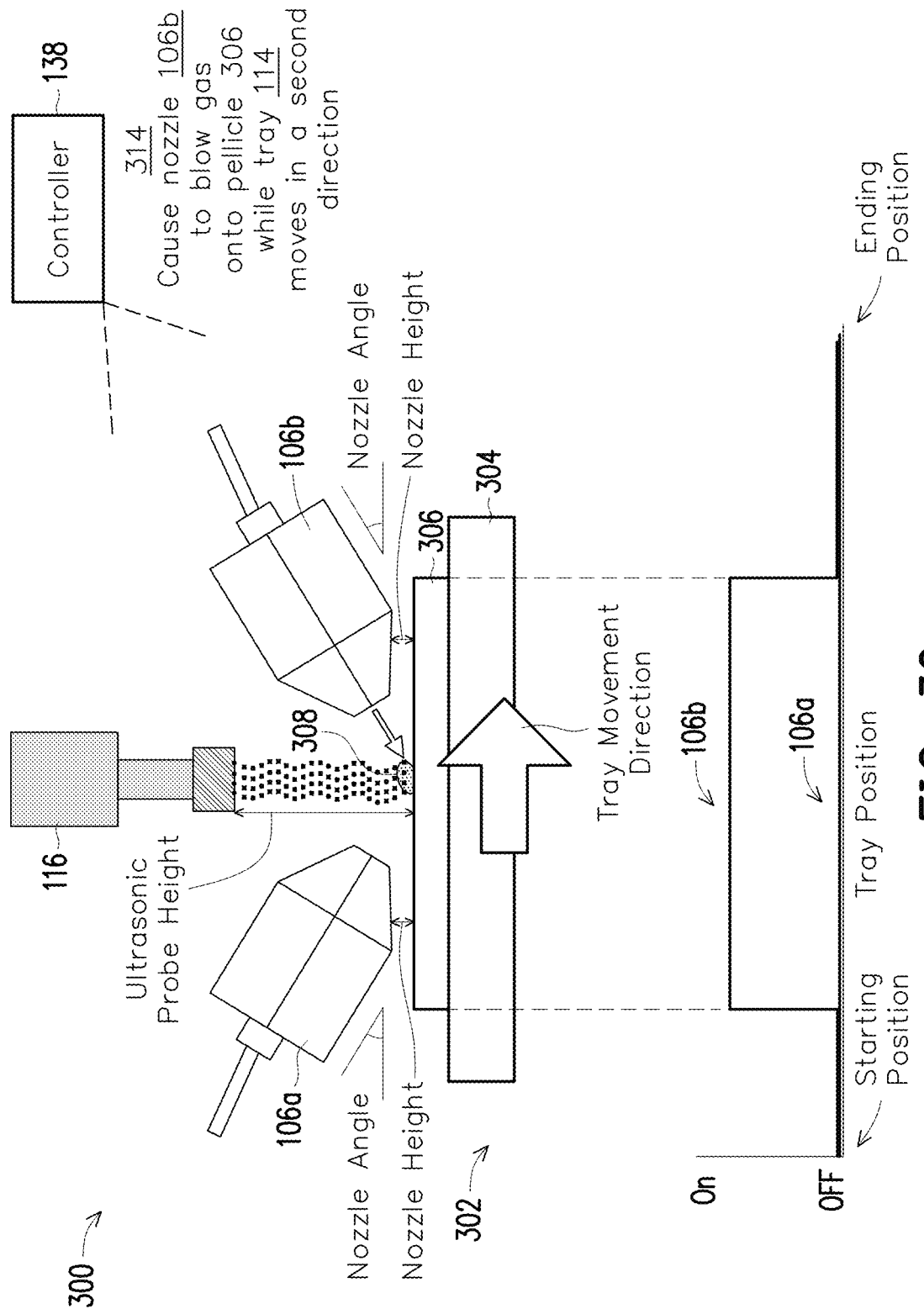

FIGS. 3A-3C are diagrams of one or more example implementations 300 described herein. As shown in FIGS. 3A-3C, example implementation(s) 300 may include photomask cleaning tool 100 and/or one or more components of photomask cleaning tool 100. Example implementation(s) 300 may be an example implementation where photomask cleaning tool 100 cleans a photomask 302. As further shown in FIGS. 3A-3C, photomask 302 may include a substrate 304 and pellicle 306 that protects a pattern formed on substrate 304. Example implementation(s) 300 may include one or more examples where photomask cleaning tool 100 cleans photomask 302 by removing a particle 308 from a surface of pellicle 306 using a multi-nozzle configuration.

As shown in FIG. 3A, and by reference number 310, controller 138 may determine one or more first parameters for tray 114, one or more second parameters for nozzles 106 (e.g., nozzle 106a and nozzle 106b), and one or more third parameters for ultrasonic probe 116. The one or more first parameters may include a quantity of cycles of tray 114 (e.g., a quantity of consecutive passes of photomask 302 under nozzles 106a and 106b), a direction of travel of tray 114, a travel sequence for tray 114 (e.g., a sequence of passes of tray 114 under nozzles 106a and 106b and the direction for each pass), a speed of travel of tray 114 (e.g., which may be a constant speed of travel or may be a variable speed of travel), and/or the like.

The one or more second parameters may include respective angles of nozzle 106a and 106b (which may be the same angle or different angles), respective heights of nozzle 106a and 106b (which may be the same height or different heights), respective gas pressures of nozzle 106a and 106b (which may be the same gas pressure or different gas pressures), respective gas velocities of nozzle 106a and 106b (which may be the same gas velocity or different gas velocities), respective on times of nozzle 106a and 106b (which may be the same on time duration or different on time durations), respective off times of nozzle 106a and 106b (which may be the same off time duration or different off time durations). An on time may refer to a time duration during which a nozzle (e.g., nozzle 106a and/or nozzle 106b) is blowing gas, whereas an off time may refer to a time duration during which a nozzle (e.g., nozzle 106a and/or nozzle 106b) is deactivated and not blowing gas. In some implementations, controller 138 may determine the one or more second parameters such that nozzle 106a and nozzle 106b are on and blowing gas during alternating on times. In these cases, nozzle 106a may be on and blowing gas during an on time and nozzle 106b may be deactivated during a corresponding off time. Then nozzle 106a and nozzle 106b may alternate such that nozzle 106b may be on and blowing gas during an on time and nozzle 106a may be deactivated during a corresponding off time. In some implementations, controller 138 may determine the one or more second parameters such that nozzle 106a and nozzle 106b are on at the same time (e.g., such that nozzle 106a and nozzle 106b have overlapping on durations) and/or off at the same time (e.g., such that nozzle 106a and nozzle 106b have overlapping off durations).

In some implementations, the on times and/or the off times for nozzle 106a and/or nozzle 106b may be configured on times and/or off times. For example, controller 138 may configure the on times and/or the off times for nozzle 106a and/or nozzle 106b based on the speed of movement of tray 114, based on the size and/or the shape of pellicle 306, and/or the like. In some implementations, controller 138 may determine the on times and/or the off times for nozzle 106a and/or nozzle 106b "on the fly" during cleaning of photomask 302. In these cases, controller 138 may determine to initiate an on time or an off time for a nozzle based on sensor information. For example, controller 138 may receive sensor information from one or more sensors included in photomask cleaning tool 100 (e.g., one or more proximity sensors, one or more magnetic or Hall effect sensors, one or more image sensors, and/or the like). Controller 138 may determine that pellicle 306 is within gas blowing range of a nozzle, and may initiate an on time for the nozzle to cause the nozzle to blow gas based on determining that pellicle 306 is within the gas blowing range of the nozzle. As another example, controller 138 may determine that pellicle 306 is not within gas blowing range of a nozzle, and may initiate an off time for the nozzle to cause the nozzle to refrain from blowing gas based on determining that pellicle 306 is not within the gas blowing range of the nozzle.

The one or more third parameters may include a height of ultrasonic probe 116, a power setting or amplitude of an ultrasonic wave to be emitted by ultrasonic probe 116, a construction of the ultrasonic wave, an on duration for ultrasonic probe 116, an off duration for ultrasonic probe 116, and/or the like.

As shown in FIGS. 3B and 3C, controller 138 may cause tray 114, nozzles 106a and 106b, ultrasonic probe 116, and/or one or more other components of photomask cleaning tool 100 to operate based on the one or more first parameters, the one or more second parameters, and/or the one or more third parameters to remove particle 308 from the surface of pellicle 306. As shown in FIG. 3B, and by reference number 312, controller 138 may cause nozzle 106a to blow gas onto pellicle 306 while tray 114 moves in a first direction. For example, controller 138 may cause blower motor 140 to generate a flow of gas to nozzle 106a, which causes nozzle 106a to blow the gas onto pellicle 306. Moreover, controller 138 may cause tray motor 142 to move tray 114 in the first direction. In some implementations, controller 138 further causes signal generator 144 to generate an ultrasonic electrical signal, which is provided to ultrasonic probe 116. Ultrasonic probe 116 may receive the ultrasonic electrical signal and may convert the ultrasonic electrical signal to an ultrasonic wave that is directed toward pellicle 306 while nozzle 106a blows gas onto pellicle 306 and while tray 114 moves in the first direction.

As further shown in FIG. 3B, tray 114 may move in the first direction from a starting position to an ending position, which may be referred to as a pass. During the pass, nozzle 106a may start in an off time, during which nozzle 106a refrains from blowing gas. Nozzle 106a may remain in the off time while pellicle 306 is not within gas blowing range of nozzle 106a such that nozzle 106a refrains from blowing gas onto portions of photomask 302 other than pellicle 306. Once the position of tray 114 reaches a point where pellicle 306 is within gas blowing range of nozzle 106a, nozzle 106a may transition from the off time to an on time, during which nozzle 106a blows gas onto pellicle 306 to remove particle 308. Nozzle 106a may remain in the on time while tray 114 moves toward the ending position until the gas blowing range of nozzle 106a reaches the end of pellicle 306. Accordingly, nozzle 106a may transition from the on time to another off time, during which nozzle 106a refrains from blowing gas onto portions of photomask 302 other than pellicle 306. In some implementations, ultrasonic probe 116 may be operated in a similar on time/off time configuration as nozzle 106a. In some implementations, nozzle 106b may remain in an off time while tray 114 moves in the first direction.

As shown in FIG. 3C, and by reference number 314, controller 138 may cause nozzle 106b to blow gas onto pellicle 306 while tray 114 moves in a second direction. Controller 138 may cause tray 114 to move in the second direction based on tray 114 reaching the ending position during the pass in which tray 114 moves in the first direction. In some implementations, the second direction may be a direction of travel opposite the first direction such that pellicle 306 passes under nozzle 106a, nozzle 106b, and ultrasonic probe 116 while moving in the second direction. Controller 138 may cause blower motor 140 to generate a flow of gas to nozzle 106b, which causes nozzle 106b to blow the gas onto pellicle 306. In some implementations, controller 138 further causes signal generator 144 to generate an ultrasonic electrical signal, which is provided to ultrasonic probe 116. Ultrasonic probe 116 may receive the ultrasonic electrical signal and may convert the ultrasonic electrical signal to an ultrasonic wave that is directed toward pellicle 306 while nozzle 106b blows gas onto pellicle 306 and while tray 114 moves in the second direction.

As further shown in FIG. 3C, tray 114 may move in the second direction from a starting position to an ending position, which may be referred to as another pass. During the other pass, nozzle 106b may start in an off time, during which nozzle 106b refrains from blowing gas. Nozzle 106b may remain in the off time while pellicle 306 is not within gas blowing range of nozzle 106b such that nozzle 106b refrains from blowing gas onto portions of photomask 302 other than pellicle 306. Once the position of tray 114 reaches a point where pellicle 306 is within gas blowing range of nozzle 106b, nozzle 106b may transition from the off time to an on time, during which nozzle 106b blows gas onto pellicle 306 to remove particle 308. Nozzle 106b may remain in the on time while tray 114 moves toward the ending position until the gas blowing range of nozzle 106b reaches the end of pellicle 306. Accordingly, nozzle 106b may transition from the on time to another off time, during which nozzle 106b refrains from blowing gas onto portions of photomask 302 other than pellicle 306. In some implementations, ultrasonic probe 116 may direct an ultrasonic wave toward pellicle 306 while nozzle 106b blows gas onto pellicle 306. In some implementations, ultrasonic probe 116 may be operated in a similar on time/off time configuration as nozzle 106b. In some implementations, nozzle 106a may remain in an off time while tray 114 moves in the second direction.

As shown in FIGS. 3B and 3C, nozzle 106a and nozzle 106b may blow gas from different directions. In some implementations, nozzle 106a and nozzle 106b blow gas at opposing or mirrored angles. In this way, nozzle 106a blows gas to apply a first removal force to particle 308, and nozzle 106b blows gas to apply a second, opposing, removal force to particle 308, to increase the likelihood that particle 308 will be removed from pellicle 306.

In some implementations, the combination of the pass in the first direction and the pass in the second direction may be referred to as a cycle. As described above, controller 138 may cause photomask cleaning tool 100 to subject photomask 302 to additional cycles based on the quantity of cycles determined as part of the one or more first parameters. Each additional cycle may include the techniques and/or actions described above in connection with reference numbers 312 and 314 and/or other techniques and/or actions. In some implementations, controller 138 may adjust the one or more first parameters, the one or more second parameters, and/or the one or more third parameters during a cycle and/or between cycles.

As indicated above, FIGS. 3A-3C are provided as one or more examples. Other examples may differ from what is described with regard to FIGS. 3A-3C.

Figure 4:
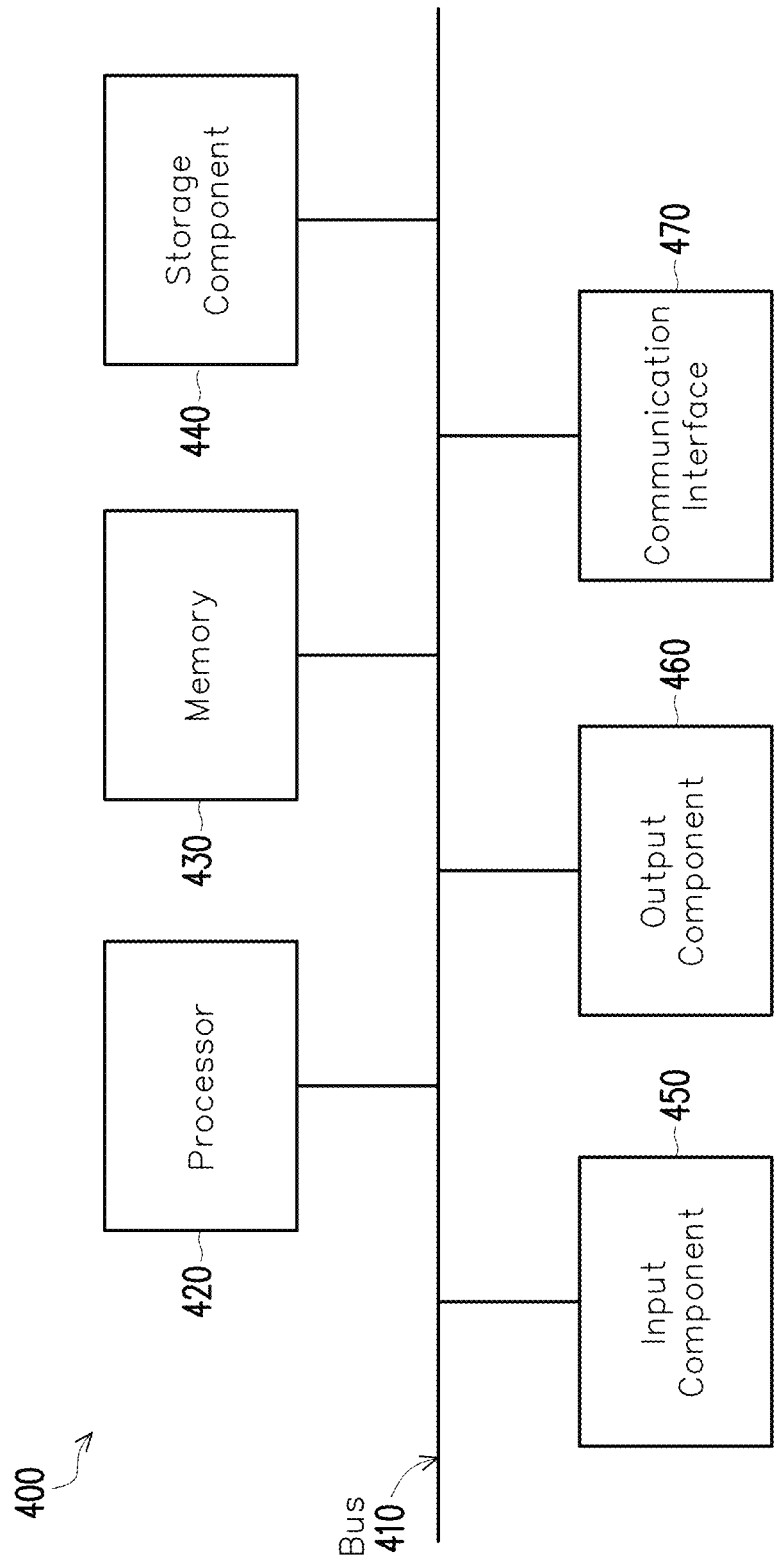
FIG. 4 is a diagram of example components of one or more devices of the photomask cleaning tool of FIGS. 1A-1E.

FIG. 4 is a diagram of example components of a device 400. Device 400 may correspond to controller 138, blower motor 140, tray motor 142, and/or signal generator 144. In some implementations, controller 138, blower motor 140, tray motor 142, and/or signal generator 144 may include one or more devices 400 and/or one or more components of device 400. As shown in FIG. 4, device 400 may include a bus 410, a processor 420, a memory 430, a storage component 440, an input component 450, an output component 460, and a communication interface 470.

Bus 410 includes a component that permits communication among multiple components of device 400. Processor 420 is implemented in hardware, firmware, and/or a combination of hardware and software. Processor 420 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 420 includes one or more processors capable of being programmed to perform a function. Memory 430 includes a random access memory (RAM), a read only memory (ROM), and/or another type of dynamic or static storage device (e.g., a flash memory, a magnetic memory, and/or an optical memory) that stores information and/or instructions for use by processor 420.

Storage component 440 stores information and/or software related to the operation and use of device 400. For example, storage component 440 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 450 includes a component that permits device 400 to receive information, such as via user input (e.g., a touch screen display, a keyboard, a keypad, a mouse, a button, a switch, and/or a microphone). Additionally, or alternatively, input component 450 may include a component for determining location (e.g., a global positioning system (GPS) component) and/or a sensor (e.g., an accelerometer, a gyroscope, an actuator, another type of positional or environmental sensor, and/or the like). Output component 460 includes a component that provides output information from device 400 (via, e.g., a display, a speaker, a haptic feedback component, an audio or visual indicator, and/or the like).

Communication interface 470 includes a transceiver-like component (e.g., a transceiver, a separate receiver, a separate transmitter, and/or the like) that enables device 400 to communicate with other devices, such as via a wired connection, a wireless connection, or a combination of wired and wireless connections. Communication interface 470 may permit device 400 to receive information from another device and/or provide information to another device. For example, communication interface 470 may include an Ethernet interface, an optical interface, a coaxial interface, an infrared interface, a radio frequency (RF) interface, a universal serial bus (USB) interface, a Wi-Fi interface, a cellular network interface, and/or the like.

Device 400 may perform one or more processes described herein. Device 400 may perform these processes based on processor 420 executing software instructions stored by a non-transitory computer-readable medium, such as memory 430 and/or storage component 440. As used herein, the term "computer-readable medium" refers to a non-transitory memory device. A memory device includes memory space within a single physical storage device or memory space spread across multiple physical storage devices.

Software instructions may be read into memory 430 and/or storage component 440 from another computer-readable medium or from another device via communication interface 470. When executed, software instructions stored in memory 430 and/or storage component 440 may cause processor 420 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 4 are provided as an example. In practice, device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
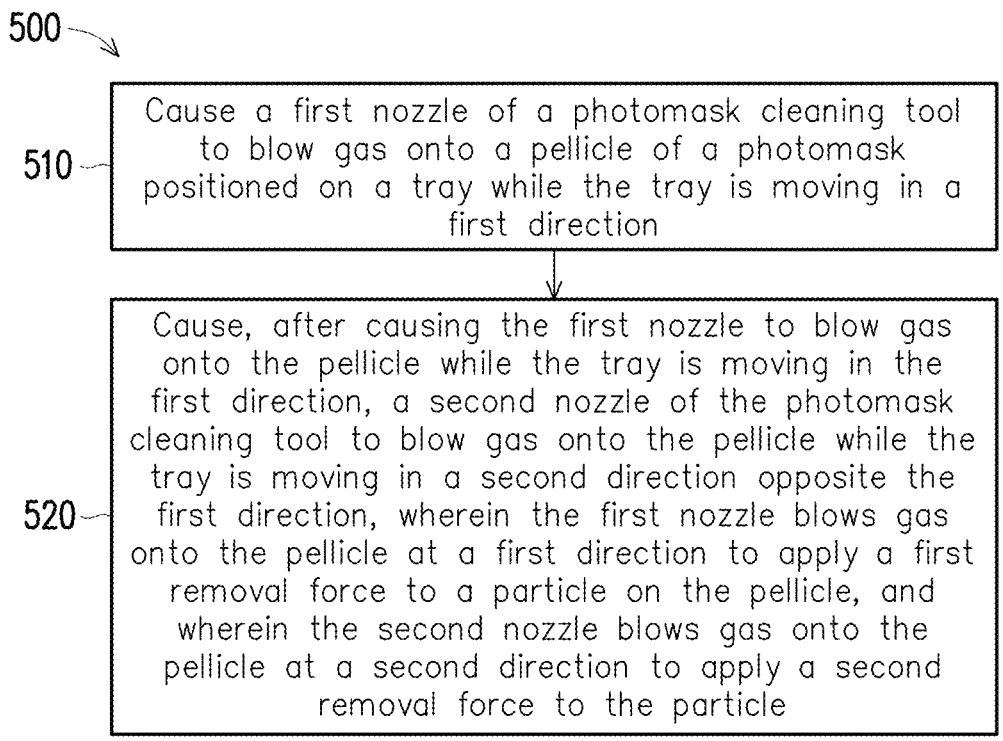
FIGS. 5 and 6 are flowcharts of example processes for removing a particle on a pellicle of a photomask.

FIG. 5 is a flow chart of an example process 500 associated with removing a particle from a pellicle of a photomask. In some implementations, one or more process blocks of FIG. 5 may be performed by controller of a photomask cleaning tool (e.g., controller 138 of photomask cleaning tool 100). In some implementations, one or more process blocks of FIG. 5 may be performed by another device or a group of devices separate from or including the photomask cleaning tool, such as blower motor (e.g., blower motor 140), a tray motor (e.g., tray motor 142), a signal generator (e.g., signal generator 144), and/or the like. Additionally, or alternatively, one or more process blocks of FIG. 5 may be performed by one or more components of a device 400, such as processor 420, memory 430, storage component 440, input component 450, output component 460, communication interface 470, and/or the like.

As shown in FIG. 5, process 500 may include causing a first nozzle of a photomask cleaning tool to blow gas onto a pellicle of a photomask positioned on a tray while the tray is moving in a first direction (block 510). For example, the controller may cause a first nozzle (e.g., nozzle 106a) of a photomask cleaning tool (e.g., photomask cleaning tool 100) to blow gas onto a pellicle (e.g., pellicle 208, pellicle 306, and/or the like) of a photomask (e.g., photomask 102, photomask 202, photomask 302, and/or the like) positioned on a tray (e.g., tray 114) while the tray is moving in a first direction, as described above.

As further shown in FIG. 5, process 500 may include causing, after causing the first nozzle to blow gas onto the pellicle while the tray is moving in the first direction, a second nozzle of the photomask cleaning tool to blow gas onto the pellicle while the tray is moving in a second direction opposite the first direction, where the first nozzle blows gas onto the pellicle at a first direction to apply a first removal force to a particle on the pellicle, and where the second nozzle blows gas onto the pellicle at a second direction to apply a second removal force to the particle (block 520). For example, the controller may cause, after causing the first nozzle to blow gas onto the pellicle while the tray is moving in the first direction, a second nozzle (e.g., nozzle 106b) of the photomask cleaning tool to blow gas onto the pellicle while the tray is moving in a second direction opposite the first direction, as described above. In some implementations, the first nozzle blows gas onto the pellicle at a first direction to apply a first removal force to a particle (e.g., particle 210, particle 308, and/or the like) on the pellicle. In some implementations, the second nozzle blows gas onto the pellicle at a second direction to apply a second removal force to the particle.

Process 500 may include additional implementations, such as any single implementation or any combination of implementations described below and/or in connection with one or more other processes described elsewhere herein.

In a first implementation, process 500 includes determining one or more parameters for the first nozzle based on at least one of a size of the particle, a shape of the particle, or a contact radius of the particle. In a second implementation, alone or in combination with the first implementation, the one or more parameters include at least one of a blowing area for the first nozzle, a gas velocity for the first nozzle, or a gas pressure for the first nozzle. In a third implementation, alone or in combination with one or more of the first and second implementations, process 500 includes causing an ultrasonic probe (e.g., ultrasonic probe 116) of the photomask cleaning tool to direct an ultrasonic wave at the pellicle while the tray is moving in the first direction, and causing the ultrasonic probe to direct the ultrasonic wave at the pellicle while the tray is sliding in the second direction, where the ultrasonic wave is reducing a surface adhesion force applied to the particle while the first removal force is applied to the particle and while the second removal force is applied to the particle.

In a fourth implementation, alone or in combination with one or more of the first through third implementations, process 500 includes determining one or more parameters for the ultrasonic probe based on at least one of a size of the pellicle, a shape of the pellicle, or a direction of travel of the tray. In a fifth implementation, alone or in combination with one or more of the first through fourth implementations, the one or more parameters for the ultrasonic probe include at least one of an on time for the ultrasonic probe, and an off time for the ultrasonic probe, the ultrasonic probe is to direct the ultrasonic wave at the pellicle during the on time, and the ultrasonic probe is to refrain from directing the ultrasonic wave at the pellicle during the off time. In a sixth implementation, alone or in combination with one or more of the first through fifth implementations, causing the first nozzle to blow gas onto the pellicle includes determining, based on a size and a shape of the pellicle, that the pellicle is positioned within a gas blowing range of the first nozzle, and causing, based on determining that the pellicle is positioned within the gas blowing range of the first nozzle, the first nozzle to blow gas onto the pellicle.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
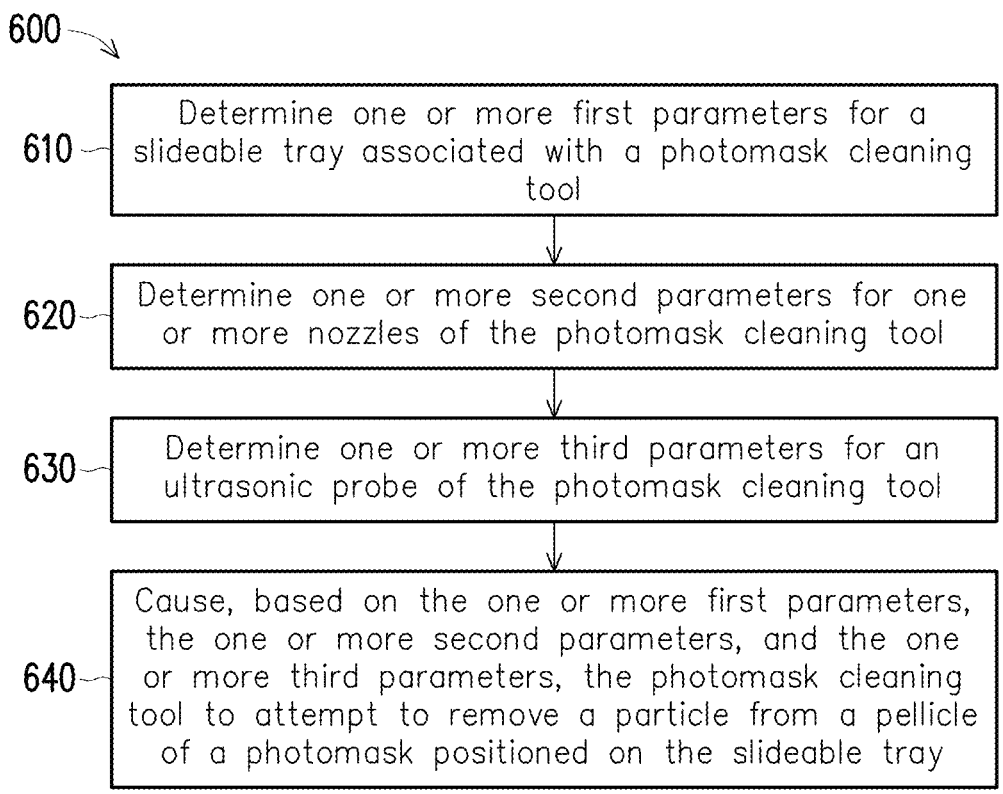

FIG. 6 is a flow chart of an example process 600 associated with removing a particle from a pellicle of a photomask. In some implementations, one or more process blocks of FIG. 6 may be performed by controller of a photomask cleaning tool (e.g., controller 138 of photomask cleaning tool 100). In some implementations, one or more process blocks of FIG. 6 may be performed by another device or a group of devices separate from or including the photomask cleaning tool, such as blower motor (e.g., blower motor 140), a tray motor (e.g., tray motor 142), a signal generator (e.g., signal generator 144), and/or the like. Additionally, or alternatively, one or more process blocks of FIG. 6 may be performed by one or more components of a device 400, such as processor 420, memory 430, storage component 440, input component 450, output component 460, communication interface 470, and/or the like.

As shown in FIG. 6, process 600 may include determining one or more first parameters for a slideable tray associated with a photomask cleaning tool (block 610). For example, the controller may determine one or more first parameters for a slideable tray (e.g., tray 114) associated with a photomask cleaning tool (e.g., photomask cleaning tool 100), as described above.

As further shown in FIG. 6, process 600 may include determining one or more second parameters for one or more nozzles of the photomask cleaning tool (block 620). For example, the controller may determine one or more second parameters for one or more nozzles (e.g., nozzle 106a, nozzle 106b, and/or the like) of the photomask cleaning tool, as described above.

As further shown in FIG. 6, process 600 may include determining one or more third parameters for an ultrasonic probe of the photomask cleaning tool (block 630). For example, the controller may determine one or more third parameters for an ultrasonic probe (e.g., ultrasonic probe 116) of the photomask cleaning tool, as described above.

As further shown in FIG. 6, process 600 may include causing, based on the one or more first parameters, the one or more second parameters, and the one or more third parameters, the photomask cleaning tool to attempt to remove a particle from a pellicle of a photomask positioned on the slideable tray (block 640). For example, the controller may cause, based on the one or more first parameters, the one or more second parameters, and the one or more third parameters, the photomask cleaning tool to attempt to remove a particle (e.g., particle 210, particle 308, and/or the like) from a pellicle (e.g., pellicle 208, pellicle 306, and/or the like) of a photomask (e.g., photomask 102, photomask 202, photomask 302, and/or the like) positioned on the slideable tray, as described above.

Process 600 may include additional implementations, such as any single implementation or any combination of implementations described below and/or in connection with one or more other processes described elsewhere herein.

In a first implementation, the one or more first parameters include a speed at which the slideable tray is to move based on a position of the slideable tray. In a second implementation, alone or in combination with the first implementation, the one or more first parameters include a quantity of cycles for the slideable tray. In a third implementation, alone or in combination with one or more of the first and second implementations, the one or more second parameters include an on time for a nozzle of the one or more nozzles, and an off time for the nozzle, the nozzle is to blow gas onto the pellicle during the on time, and the nozzle is to refrain from blowing gas onto the pellicle during the off time.

In a fourth implementation, alone or in combination with one or more of the first through third implementations, process 600 includes determining the on time and the off time based on a direction of travel of the slideable tray, and a position of the slideable tray. In a fifth implementation, alone or in combination with one or more of the first through fourth implementations, the one or more third parameters include a distance between the ultrasonic probe and the pellicle, a power setting for the ultrasonic probe, or a construction of an ultrasonic wave provided by the ultrasonic probe.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a photomask cleaning tool (e.g., photomask cleaning tool 100) includes various components to automatically remove a particle from a pellicle, such as a multi-jet nozzle to standardize and control the use of a gas to remove the particle, an ultrasonic probe to loosen the particle from the surface of the pellicle, a plurality of multi-jet nozzles to direct gas toward the particle from different directions, a control system to control the various components for various sizes and shapes of photomasks and for optimized particle removal techniques, and/or the like. In this way, the photomask cleaning tool is capable of removing a particle from a pellicle of a photomask in a manner that increases the effectiveness of removing the particle and reduces the likelihood of damage to the pellicle, which would otherwise result in expensive and time-consuming photomask rework.

As described in greater detail above, some implementations described herein provide a photomask cleaning tool. The photomask cleaning tool includes a nozzle to blow gas onto a pellicle of a photomask to remove a particle from a surface of the pellicle. The photomask cleaning tool includes an ultrasonic probe to direct an ultrasonic wave toward the surface of the pellicle. Vibration of the surface of the pellicle, caused the ultrasonic wave, reduces a surface adhesion force between the particle and the surface of the pellicle. The photomask cleaning tool includes a tray motor to move a slideable tray, supporting the photomask, while at least one of the nozzle blows gas onto the pellicle or the ultrasonic probe directs the ultrasonic wave toward the surface of the pellicle.

As described in greater detail above, some implementations described herein provide a method. The method includes causing, by a controller of a photomask cleaning tool, a first nozzle of the photomask cleaning tool to blow gas onto a pellicle of a photomask positioned on a tray while the tray is moving in a first direction. The method includes causing, by the controller and after causing the first nozzle to blow gas onto the pellicle while the tray is moving in the first direction, a second nozzle of the photomask cleaning tool to blow gas onto the pellicle while the tray is moving in a second direction opposite the first direction. The first nozzle blows gas onto the pellicle at a first direction to apply a first removal force to a particle on the pellicle. The second nozzle blows gas onto the pellicle at a second direction to apply a second removal force to the particle.

As described in greater detail above, some implementations described herein provide a device. The device includes one or more memories and one or more processors, communicatively coupled to the one or more memories. The one or more memories and the one or more processors are to determine one or more first parameters for a slideable tray associated with a photomask cleaning tool. The one or more memories and the one or more processors are to determine one or more second parameters for one or more nozzles of the photomask cleaning tool. The one or more memories and the one or more processors are to determine one or more third parameters for an ultrasonic probe of the photomask cleaning tool. The one or more memories and the one or more processors are to cause, based on the one or more first parameters, the one or more second parameters, and the one or more third parameters, the photomask cleaning tool to attempt to remove a particle from a pellicle of a photomask positioned on the slideable tray.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask cleaning tool, comprising:
a plurality of nozzles to blow a gas onto a same surface of a pellicle of a photomask to remove a particle from the same surface of the pellicle,
wherein the plurality of nozzle comprises a first nozzle, at a first angle relative to the photomask, and a second nozzle, at a second angle, relative to the photomask, different from the first angle;
a transmitter device to convert a received electrical signal into an ultrasonic wave and to direct the ultrasonic wave toward the same surface of the pellicle,
wherein vibration of the same surface of the pellicle, caused by the transmitter device, reduces a surface adhesion force between the particle and the same surface of the pellicle; and
a tray motor,
wherein the tray motor is to move a slideable tray, supporting the photomask, in a first direction while the first nozzle blows the gas onto the pellicle, and
wherein the tray motor is to move the slideable tray in a second direction, opposite of the first direction, while the second nozzle blows the gas onto the pellicle and the transmitter device directs the ultrasonic wave toward the same surface of the pellicle.

2. The photomask cleaning tool of claim 1, wherein at least one of the first nozzle or the second nozzle includes a plurality of openings through which the gas is to be blown, and
wherein a spacing between the plurality of openings results in a blow pattern that substantially covers a width of the pellicle.

3. The photomask cleaning tool of claim 1, wherein at least one of the first nozzle or the second nozzle includes a plurality of openings through which the gas is to be blown, and
wherein a length of an opening of the plurality of openings results in a flow of gas through the opening having a flow width substantially equal to a spacing between the plurality of openings.

4. The photomask cleaning tool of claim 1, further comprising:
a controller to at least one of:
cause the tray motor to move the slideable tray in at least one of the first direction or the second direction,
cause at least one of the first nozzle or the second nozzle to blow the gas onto the pellicle, or
stop the at least one of first nozzle or the second nozzle from blowing the gas onto the pellicle,
cause the transmitter device to direct the ultrasonic wave toward the same surface of the pellicle, or
stop the transmitter device from directing the ultrasonic wave toward the same surface of the pellicle.

5. A method, comprising:
causing, by a controller of a photomask cleaning tool and while a tray supporting a photomask is moving in a first direction, a first nozzle, of the photomask cleaning tool, at a first angle, relative to the photomask, to blow a gas at a first removal force onto a pellicle of the photomask to remove a particle from the pellicle; and
causing, by the controller and while the tray is moving in a second direction opposite of the first direction:
a second nozzle, of the photomask cleaning tool, at a second angle, relative to the photomask and different from the first angle, to blow the gas at a second removal force onto the pellicle to remove the particle from the particle,
wherein the first nozzle and the second nozzle blow the gas onto a same surface of the pellicle of the photomask, and
a transmitter device, of the photomask cleaning tool and situated between the first nozzle and the second nozzle, to convert a received electrical signal into an ultrasonic wave and to direct the ultrasonic wave at the pellicle.

6. The method of claim 5, further comprising:
determining one or more parameters for at least one of the first nozzle or the second nozzle based on at least one of:
a size of the particle,
a shape of the particle, or
a contact radius of the particle.

7. The method of claim 6, wherein the one or more parameters comprise at least one of:
a blowing area for the at least one of the first nozzle or the second nozzle,
a gas velocity for the at least one of the first nozzle or the second nozzle, or
a gas pressure for the at least one of the first nozzle or the second nozzle.

8. The method of claim 5, wherein the ultrasonic wave reduces a surface adhesion force applied to the particle while the first removal force is applied to the particle and while the second removal force is applied to the particle.

9. The method of claim 5, further comprising:
determining one or more parameters for the transmitter device based on at least one of:
a size of the pellicle,
a shape of the pellicle, or
the first direction or the second direction of the tray.

10. The method of claim 9, wherein the one or more parameters for the transmitter device comprise at least one of:
an on time for the transmitter device, and
an off time for the transmitter device,
wherein the transmitter device is to direct the ultrasonic wave at the pellicle during the on time, and
wherein the transmitter device is to refrain from directing the ultrasonic wave at the pellicle during the off time.

11. The method of claim 5, wherein causing the first nozzle to blow the gas onto the pellicle comprises:
determining, based on a size and a shape of the pellicle, that the pellicle is positioned within a gas blowing range of the first nozzle; and
causing, based on determining that the pellicle is positioned within the gas blowing range of the first nozzle, the first nozzle to blow the gas onto the pellicle.

12. A device, comprising:
one or more memories; and
one or more processors, coupled to the one or more memories, to:
determine one or more first parameters for a slideable tray of a photomask cleaning tool;
determine one or more second parameters for a plurality of nozzles of the photomask cleaning tool,
wherein the one or more second parameters comprise:
a first angle, of a first nozzle of the plurality of nozzles, relative to a photomask,
a second angle, of a second nozzle of the plurality of nozzles, relative to the photomask, and
an on time for each of the first nozzle and the second nozzle to blow a gas onto a same surface of a pellicle of the photomask;
determine one or more third parameters for a transmitter device of the photomask cleaning tool, wherein the transmitter device is to convert a received electrical signal into an ultrasonic wave and to direct the ultrasonic wave at a pellicle of a photomask on the slideable tray; and
cause, based on the one or more first parameters, the one or more second parameters, and the one or more third parameters:
while the slideable tray is moving in a first direction, the one or more nozzles to blow the gas onto the pellicle, and
while the slideable tray is moving in a second direction opposite of the first direction, the one or more nozzles to blow the gas onto the pellicle and the transmitter device to direct the ultrasonic wave at the pellicle.

13. The device of claim 12, wherein the one or more first parameters comprise a speed at which the slideable tray is to move based on a position of the slideable tray.

14. The device of claim 12, wherein the one or more first parameters comprise a quantity of cycles for the slideable tray.

15. The device of claim 12, wherein the one or more second parameters further comprise:
   an off time for at least one of the first nozzle or the second nozzle to refrain from blowing the gas onto the pellicle.

16. The device of claim 15, wherein the one or more processors, when determining the one or more second parameters, are to:
   determine the on time and the off time based on:
      the first direction or the second direction of the slideable tray, and
      a position of the slideable tray.

17. The device of claim 12, wherein the one or more third parameters comprise:
   a distance between the transmitter device and the pellicle,
   a power setting for the transmitter device, or
   a construction of the ultrasonic wave provided by the transmitter device.

18. The photomask cleaning tool of claim 1, further comprising:
   a housing supporting the slideable tray; and
   a plurality of support structures, connected to the housing, supporting the plurality of nozzles.

19. The method of claim 5, further comprising:
   causing the tray to move in the first direction; and
   causing, after causing the tray to move in the first direction, the tray to move in the second direction.

20. The device of claim 12, wherein the one or more second parameters further comprise:
   a height of at least one of the first nozzle or the second nozzle,
   a gas pressures of the at least one of the first nozzle or the second nozzle, or
   a gas velocity of the at least one of the first nozzle or the second nozzle.

* * * * *